(12) United States Patent
Allen

(10) Patent No.: US 9,419,644 B2
(45) Date of Patent: Aug. 16, 2016

(54) SYSTEM, CIRCUIT AND METHOD FOR CONVERTING A DIFFERENTIAL VOLTAGE SIGNAL INCLUDING A HIGH COMMON MODE VOLTAGE COMPONENT TO A GROUND REFERENCED SIGNAL FOR BATTERY VOLTAGE MANAGMENT

(71) Applicant: INTERSIL AMERICAS LLC, Milpitas, CA (US)

(72) Inventor: Anthony John Allen, Campbell, CA (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 14/592,736

(22) Filed: Jan. 8, 2015

(65) Prior Publication Data

US 2016/0056837 A1 Feb. 25, 2016

Related U.S. Application Data

(60) Provisional application No. 62/038,867, filed on Aug. 19, 2014.

(51) Int. Cl.
*H03M 3/00* (2006.01)
*H03K 19/0175* (2006.01)
(Continued)

(52) U.S. Cl.
CPC ....... *H03M 3/394* (2013.01); *H03K 19/017509* (2013.01); *H03M 3/464* (2013.01); *H03M 3/472* (2013.01); *H02J 7/008* (2013.01); *H02J 7/022* (2013.01); *H02J 7/345* (2013.01); *H03M 1/12* (2013.01); *H03M 3/30* (2013.01); *Y02E 60/12* (2013.01)

(58) Field of Classification Search
CPC .......... H03M 3/30; H03M 1/12; Y02E 60/12; Y02J 7/0031; H02J 7/022; H02J 7/008; H02J 7/345
USPC .......... 341/143, 155; 320/134, 128, 167, 145, 320/163
See application file for complete search history.

(56) References Cited

U.S. PATENT DOCUMENTS 9,018,892 B2 * 4/2015 Agarwal ............... H02J 7/0016
320/101

OTHER PUBLICATIONS

"Lithium Ion Battery Monitoring System", "AD7280A", 2011, pp. 1-48, Publisher: Analog Devices, Inc., Published in: Norwood, MA.
(Continued)

*Primary Examiner* — Joseph Lauture
(74) *Attorney, Agent, or Firm* — Fogg & Powers LLC

(57) ABSTRACT

A system, circuit and method for converting a differential voltage signal including a high common mode voltage component to a ground referenced signal are disclosed. For example, a circuit for converting a differential voltage signal including a high common mode voltage component to a ground referenced signal is disclosed. The circuit includes a comparator configured to receive a differential voltage signal including a high common mode voltage component, and output a digital signal associated with the differential voltage signal. The circuit also includes a level shifter configured to receive the digital signal and shift the level of the digital signal to a low level, and an integrator configured to receive the digital low level signal and output a ramping voltage associated with the low level signal. Furthermore, the circuit includes an analog-to-digital converter configured to receive the ramping voltage and output a digital bit-stream associated with the ramping voltage.

20 Claims, 3 Drawing Sheets

(51) Int. Cl.
  *H02J 7/34* (2006.01)
  *H03M 1/12* (2006.01)
  *H02J 7/00* (2006.01)
  *H02J 7/02* (2016.01)

(56) References Cited

OTHER PUBLICATIONS

"Li-Ion, NiMH Battery Measuring, Charge Balancing and Power-supply Circuit", "Atmel ATA 6870", 2012, pp. 1-51.

"Multi-Cell Li-Ion Battery Manager", "ISL94212 Datasheet", Dec. 14, 2012, pp. 1-70, Publisher: Intersil.

"LTC6803-1/LTC6803-3 Multicell Battery Stack Monitor", 2011, pp. 1-40, Publisher: Linear Technology Corporation.

"LTC6802-1 Multicell Battery Stack Monitor", 2008, pp. 1-32, Publisher: Linear Technology Corporation.

"LTC6804-1/LTC6804-2 Multicell Battery Monitors", 2013, pp. 1-72, Publisher: Linear Technology Corporation.

"bq769x0 3-Series to 15-Series Cell Battery Monitor Family for Li-Ion and Phosphate Applications", Jul. 2014, pp. 1-54, Publisher: Texas Instruments.

* cited by examiner

SYSTEM, CIRCUIT AND METHOD FOR CONVERTING A DIFFERENTIAL VOLTAGE SIGNAL INCLUDING A HIGH COMMON MODE VOLTAGE COMPONENT TO A GROUND REFERENCED SIGNAL FOR BATTERY VOLTAGE MANAGMENT

CROSS-REFERENCE TO RELATED APPLICATIONS

This application is related to U.S. Provisional Patent Application Ser. No. 62/038,867 entitled "SYSTEM AND METHOD FOR CONVERTING FROM A HIGH COMMON MODE VOLTAGE TO A LOW COMMON MODE VOLTAGE IN A SEMICONDUCTOR STRUCTURE," filed on Aug. 19, 2014 and incorporated herein by reference. This application hereby claims to the benefit of U.S. Provisional Patent Application Ser. No. 62/038,867.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings.

Figure 1:
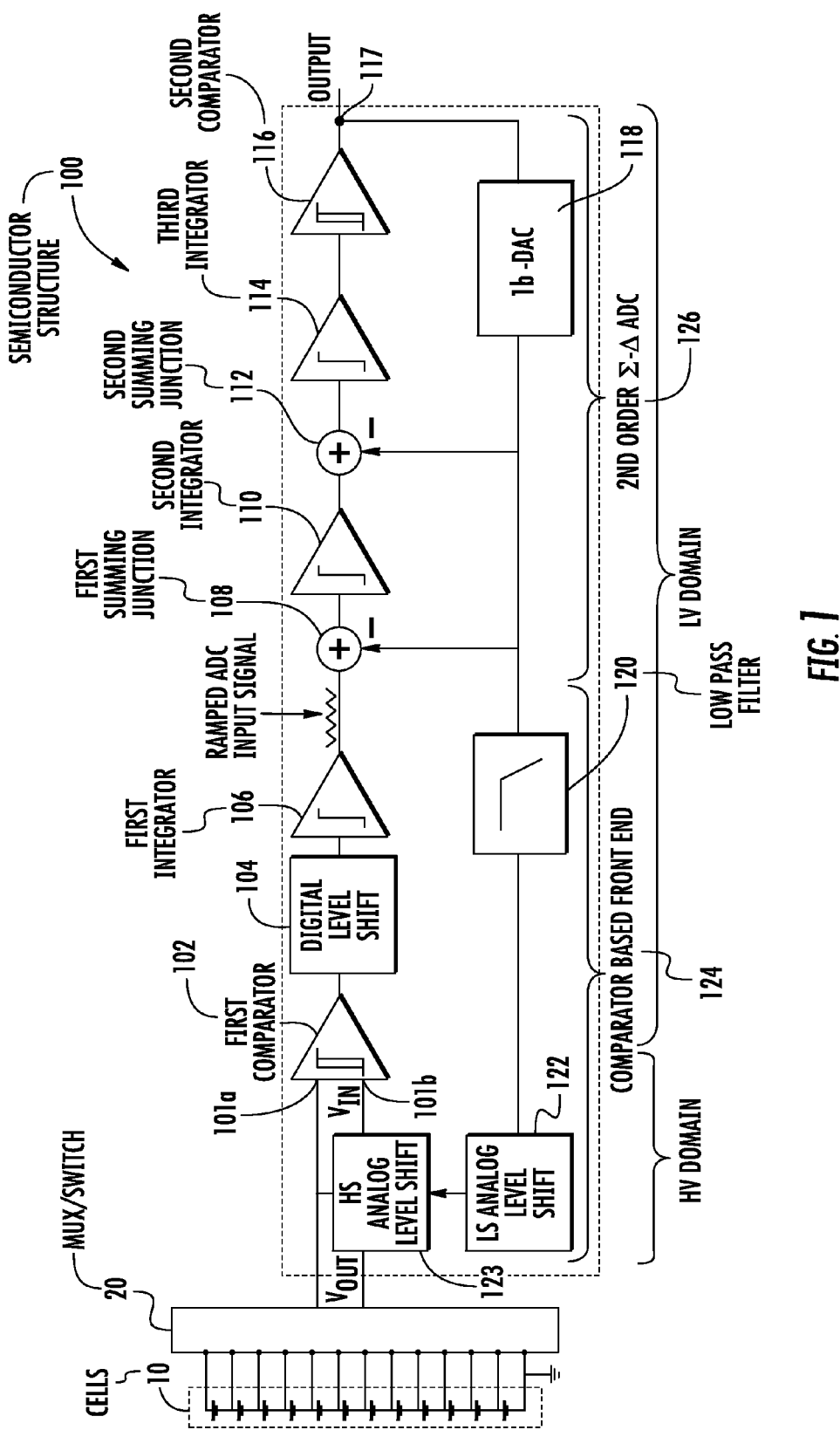
FIG. 1 depicts a schematic block diagram of a circuit that can be utilized to convert a differential voltage signal including a high common mode voltage component to a ground referenced signal, in accordance with one exemplary embodiment of the present invention.

In the following detailed description, reference is made to the accompanying drawings that form a part hereof, and in which are shown by way of specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be construed in a limiting sense. Wherever possible, the same or like reference numbers are used throughout the drawings to refer to the same or like structural components or parts.

A significant problem is encountered with systems utilized to monitor or measure the voltages of individual cells within a stack of rechargeable battery cells. For example, in certain applications, one or more stacks of rechargeable Lithium Ion or similar cells can be utilized in battery packs to provide power for electrically-driven automotive vehicles, such as electric vehicles (EVs), hybrid EVs (HEVs), plug-in HEVs (PHEVs), electric motorcycles, electric scooters, and the like. In order to measure the voltage of each individual cell, the cell voltage can be sensed and coupled, for example, to the inverting and non-inverting inputs of a difference amplifier. The common mode voltage signal at the output of the difference amplifier is coupled to a monitoring circuit utilized, for example, in an application front end (AFE) circuit, to measure the voltages of the individual cells. However, since the voltage signal of each cell being input to the monitoring circuit is at a high common mode voltage level, this high level common mode voltage has to be converted to a low level common mode voltage before the voltage signal information can be utilized. More precisely, the monitoring circuit senses the signal at the high common mode voltage level, shifts the sensed voltage signal to a low common mode voltage level, and couples the low level common mode voltage information to a low voltage measurement circuit. For example, the low voltage measurement circuit can include a multiplexer that receives each one of the multiple signals at the low common mode voltage level, and outputs each signal to an analog-to-digital converter (ADC).

In other applications, higher precision voltage measurements may be required. In certain applications, for example, a thermocouple sensor can be connected across the inverting and non-inverting inputs of an instrumentation amplifier, and the high level common mode voltage signal at the output of the instrumentation amplifier is coupled to the measurement circuit being utilized.

A significant problem encountered with both the cell voltage monitoring circuits and higher precision voltage measurement circuits that process differential voltage signals including common mode voltage components is that the technical approach utilized to convert and transfer the differential voltage signal information including high common mode voltage components to the low voltage measurement circuits is subject to a variety of errors and consequently requires extensive temperature and voltage calibration procedures to be followed in order to obtain suitable levels of accuracy. Consequently, the costs for testing such circuits can be between 50% and 75% of the total cost for the semiconductor system products involved. More precisely, a problem that these voltage monitoring and measurement systems share is that the process of converting the sensed differential voltage signals including high common mode voltage component information so that it can be level shifted to the ground referenced level is accomplished with circuits that operate in the high voltage domain, and this conversion is made more difficult to accomplish as a result. Consequently, the level shift circuitry utilized has substantial offset, gain and linearity errors that must be compensated for by the calibration procedures involved.

Embodiments of the present disclosure provide a circuit that converts a differential voltage signal including a high common mode voltage component to a ground referenced signal, and overcomes the problems encountered by other voltage monitoring and measuring systems. The circuit receives a differential voltage signal including a high common mode voltage component, level shifts the differential voltage signal to a low level ramping voltage signal, and couples the low level ramping voltage signal to the input of an ADC. The conversion from a differential voltage signal including a high common mode voltage component to a ground referenced signal is accomplished without needing to generate an accurate reference signal in the high voltage domain. In one exemplary embodiment, the circuit includes a comparator-based front end circuit with a feedback loop that controls the input of a $2^{nd}$ order sigma delta ADC. This feedback loop is separate from the feedback loop of the ADC. One benefit of this circuit arrangement is that the level shift signal utilized to shift the feedback signal at the reference input of the comparator to the high voltage domain, is generated in the low voltage domain. Consequently, if precision voltage measurements are required, the circuit described herein is smaller in area, less complex, easier to design, and thus less costly to fabricate than other (e.g., semiconductor) voltage monitoring and measurement circuits. Another benefit of this circuit arrangement is that the only trim process required for the circuitry utilized to process the differential voltage signals including the high common mode voltage components involved is merely to compensate for comparator offset errors. Therefore, the cost of testing such a circuit in semiconductor form is substantially less than for other semiconductor circuits that perform similar functions.

Essentially, the embodiments described herein can be implemented to monitor and/or measure differential voltage signals including high common mode voltage components in systems and products, and convert the differential voltage signals including high common mode voltage components to ground referenced signals in a manner that provides lower implementation and testing costs than existing designs. For example, the circuit described herein can be implemented to monitor and/or measure the voltages of rechargeable batteries such as, for example, Lithium Ion batteries and the like. As such, these batteries can be utilized to power such products as hybrid electric vehicles, e-bikes, e-motorcycles, power tools, laptop computers, servers, power storage systems and the like.

FIG. 1 depicts a schematic block diagram of a circuit 100 that can be utilized to convert a differential voltage signal including a high common mode voltage component to a ground referenced signal, in accordance with one exemplary embodiment of the present invention. In the exemplary embodiment shown, circuit 100 can be formed on a semiconductor integrated circuit (IC). As such, for example, in some embodiments, circuit 100 can include all or part of a front-end (e.g., AFE) circuit utilized to measure the voltage of each cell within a stack of battery cells. In some embodiments, circuit 100 can formed alone, for example, as a circuit on an IC, wafer, chip or die. In other embodiments, circuit 100 can be formed as a component of a system or product on a semiconductor IC, wafer, chip or die.

Referring to FIG. 1, for the exemplary embodiment shown, circuit 100 includes a first comparator 102, a digital level shifter 104, a first integrator 106, a first summing junction 108, a second integrator 110, a second summing junction 112, a third integrator 114, a second comparator 116, a 1-bit digital-to-analog converter (DAC) 118, a low pass filter 120, a first (low side) analog level shifter 122, and a second (high side) analog level shifter 123.

In the exemplary embodiment shown, first comparator 102 receives a differential voltage signal across its first input 101a and second input 101b, and the differential voltage signal includes a high common mode voltage component. The differential voltage signal is to be converted and output as a ground referenced signal. For example, in one embodiment, the received differential voltage signal can be the sensed voltage of a Lithium Ion cell or other type of rechargeable battery cell. In a second embodiment, the received differential voltage signal can be the sensed voltage of a non-rechargeable battery cell. In still another embodiment, the received differential voltage signal can be a difference voltage signal output from a circuit, system or voltage source, and the resulting differential voltage signal is to be converted and output as a ground referenced signal.

In the exemplary embodiment shown in FIG. 1, a multiplexer (or transistor switch) 20 is utilized to couple the individual differential voltages (e.g., Vout) of a plurality of cells 10 to an input 101a (e.g., Vin) of first comparator 102 and an input of the high side analog level shifter 123. An output of the high side analog level shifter 123 is coupled to the second input 101b of first comparator 102. Also, an output of the low side analog shifter 122 is coupled to a second input of the high side analog level shifter 123. As such, the high side and low side analog level shifter circuitry applies an offset to the one side of the differential voltage from the cells (e.g., at input 101b) such that the input voltage to the first comparator 102 is zero when the received cell differential voltage and the level-shifted analog voltage (from the high side and low side analog level shifters) are equal. Notably, although a multiplexer or transistor switch is utilized in the exemplary embodiment shown, in a different embodiment, the individual differential voltages of the plurality of cells 10 can be coupled, for example, to the respective inputs of a corresponding plurality of circuits 100. For example, the individual differential voltages of the 12 cells shown in FIG. 1 can be coupled to 12 embodiments of circuit 100. As another example, the individual differential voltages of the 12 cells shown in FIG. 1 can be coupled to 12 first comparators 102, and a multiplexer can be utilized to couple voltage signals between the 12 first comparators 102 and the single digital and analog level shifters shown. In other words, the conversion from a differential voltage signal including a high common mode voltage component to a ground referenced output signal as described herein is not limited to the specific voltage sensing and/or input coupling arrangement involved.

Returning to the exemplary embodiment shown in FIG. 1, the output of the first comparator 102 is coupled to the input of a digital level shifter 104. In this embodiment, the digital level shifter is a high speed, high voltage (e.g., 40V) to low voltage (e.g., 2.5V) level shifter, which shifts the high level digital signal at the output of the first comparator 102 down to a low level digital signal (e.g., ground-referenced signal). As such, circuit 100 advantageously provides a digital level shifter instead of the much larger and slower analog level shifters utilized at the front end of other measurement systems. The output of the digital level shifter 104 is coupled to a first integrator 106, which integrates the low level digital signal (e.g., ground-referenced signal) and outputs a voltage ramp signal (e.g. ground-referenced voltage ramping signal) corresponding to the low level digital signal. The average value of this voltage ramp signal represents the value of the input (e.g., cell) voltage to the first comparator 102. In the exemplary embodiment shown, the voltage ramp signal is coupled to the input of a second order sigma-delta ADC 126, which is described in detail below.

The input to the second order sigma-delta ADC 126 is the first summing junction 108. The low level voltage ramp signal at the output of the first integrator 106 is coupled to the first summing junction 108, and algebraically added to a negative feedback signal received from the streaming output of a 1-bit digital-to-analog converter (DAC) 118. The negative feedback loop from the output 117 of the ADC 126 through the 1-bit DAC 118 and back to the first summing junction 108 forces the average DC voltage at the negative input to the first summing junction 108 to be equal to the voltage ramp signal received from the first integrator 106. The signal output from the first summing junction 108 is coupled to a second integrator 110. The output of the second integrator 110 is coupled to a second summing junction 112, and algebraically added to the signal from the 1-bit DAC 118. The output of the second summing junction 112 is coupled to a third integrator 114, and the output of the third integrator 114 is coupled to a second comparator 116. The output of the second comparator 116 is coupled to the input of the 1-bit DAC 118, and the output of the 1-bit DAC 118 is coupled to the first and second summing junctions, 108, 112, and the input of a low pass filter 120. The output of the low pass filter 120 is coupled to the input of an analog level shifter 122, and the output of the analog level shifter 122 is coupled to the second or reference input of the first comparator 102. Notably, as indicated in the exemplary embodiment shown in FIG. 1, circuit 100 provides a comparator-based front end circuit 124 that shifts the level of the input differential voltage signal including a high common mode voltage component to a ground referenced signal, and a $2^{nd}$ order sigma-delta ADC 126 that converts the ground referenced signal to a digital signal. Also, note that in some embodiments, other integrating types of ADCs can be utilized for ADC 126 instead of a $2^{nd}$ order ADC. Notably, higher orders of quantization noise shaping and higher signal-to-noise ratios can be developed in circuits including higher order ADCs.

In operation, for the exemplary embodiment shown in FIG. 1, the output of the first comparator 102 is a digital signal with values of "one" or "zero" which is shifted down to a lower level digital signal, and coupled to the first integrator 106. The first integrator 106 outputs a ramped voltage signal to the input of the ADC 126. A voltage signal that is the algebraic sum of the two voltage signals input to the first summing junction 108 is integrated by the second integrator 110 and coupled to the second summing junction 112. A second voltage signal that is the algebraic sum of the two voltage signals input to the second summing junction 112 is integrated by the third integrator 114 and coupled to the input of the second comparator 116. In this example embodiment, the second comparator 116 is configured as a one-bit ADC, and outputs a one-bit data stream to the output 117 of the circuit 100.

The one-bit data stream at the output of the second comparator 116 is coupled to the one-bit DAC 118. The voltage signal at the output of the one-bit DAC 118 is coupled to the second summing junction 112. This negative feedback loop from the output of the second comparator 116 and through the one-bit DAC 118 to the second summing junction 112 forces the average DC voltage at the negative input to the second summing junction 112 to be equal to the voltage at its other input (i.e., the voltage at the output of the second integrator 110). Essentially, the second summing junction 112, third integrator 114, second comparator 116, and one-bit DAC 118 form a first order sigma-delta ADC.

The voltage signal at the output of the one-bit DAC 118 is also coupled to the first summing junction 108. This negative feedback loop from the output of the second comparator 116 and through the one-bit DAC 118 to the first summing junction 108 forces the average DC voltage at the negative input to the first summing junction 108 to be equal to the voltage at its other input (i.e., the voltage at the output of the first integrator 106). As such, the addition of the first summing junction 108 and the second integrator 110 to the first order sigma-delta ADC forms the second order sigma-delta ADC 126.

The reference voltage at the second input of the first comparator 102 is derived from the bit-stream output of the ADC 126. The source for this reference voltage is the feedback signal from the one-bit DAC 118. Specifically, the filtered analog voltage (sequence of voltages) from the one-bit DAC 118 is converted to a current signal by the low pass filter 120 and low side analog level shifter 122. This current signal is then coupled to the high side analog level shifter 123, which applies an offset to one side (e.g., at input 101b of first comparator 102) of the differential voltage signal input from the cells such that the voltage at the comparator input is zero when the received (cell) differential voltage and the level shifted analog voltage (e.g., from the high side analog level shifter 123) are equal. Thus, the resulting "reference signal" is utilized with the first comparator 102 and integrators 106, 110, 114 to produce a feedback system that maintains the input of the ADC 126 at the correct voltage to provide an accurate analog-to-digital conversion of the input voltage (e.g., cell voltage) being measured. In the exemplary embodiment shown, the input to the ADC 126 is the ramping voltage signal produced by the switching function of the first comparator 102 in response to the reference voltage signal from the analog level shifter 123. The average value of the ramping voltage signal at the input of the ADC 126 represents the input voltage (e.g., cell voltage) being measured. As a design advantage, the switching frequency of the first comparator 102 can be tuned to a low frequency that is much lower than the switching frequency utilized in other ADCs, hence a relatively low speed comparator can be utilized.

An advantage of circuit 100 over other (e.g., AFE) monitoring and/or measurement circuits is that the current conversion provided in the feedback loop of circuit 100 to produce the high level, reference voltage signal is implemented in the low voltage domain, and precision circuits (e.g., voltage measurement and/or instrumentation circuits) are much easier to design and fabricate in the low voltage domain rather than in the high voltage domain. Another advantage of circuit 100 is only one current generator (e.g., 120) is needed, because any number of the voltages to be measured (e.g., cell voltages) can be accommodated by steering the current from the one current generator to the appropriate input comparator (e.g., utilizing multiple first comparators 102). In this case, the outputs of the multiple comparators can be digitally multiplexed back to low voltage levels. The integrating properties of the sigma-delta ADC 126 in circuit 100 can then be utilized by design to filter the resulting ramping voltage input signal in order to provide the measurement accuracy required.

Additionally, the circuit 100 utilized only requires a single voltage-to-current generator (120) to be trimmed to provide the accuracy desired. Also, this single voltage-to-current generator can be made very stable over temperature. Consequently, since the performance of the voltage-to-current transfer of this generator typically can be determined merely by the matching of two resistors, the circuit 100 utilized can be designed so that the calibration of the voltage-to-current transfer is only required to be performed at a single temperature. The individual high voltage comparators (e.g., if multiple first comparators 102 are utilized) may also require calibration, but this is generally limited only to compensation for offset errors since no gain or linearity correction is required for such comparators. Additionally, each comparator 102 utilized can be designed to have a predictable offset behavior over temperature, which again eliminates the need to calibrate these comparators with respect to temperature. A salient result is that a low cost circuit 100 can be provided to convert a differential voltage signal including a high common mode voltage component to a ground referenced signal, by reducing the silicon areas and testing costs of the semiconductor ICs, wafers, chips or dies involved.

Figure 2:
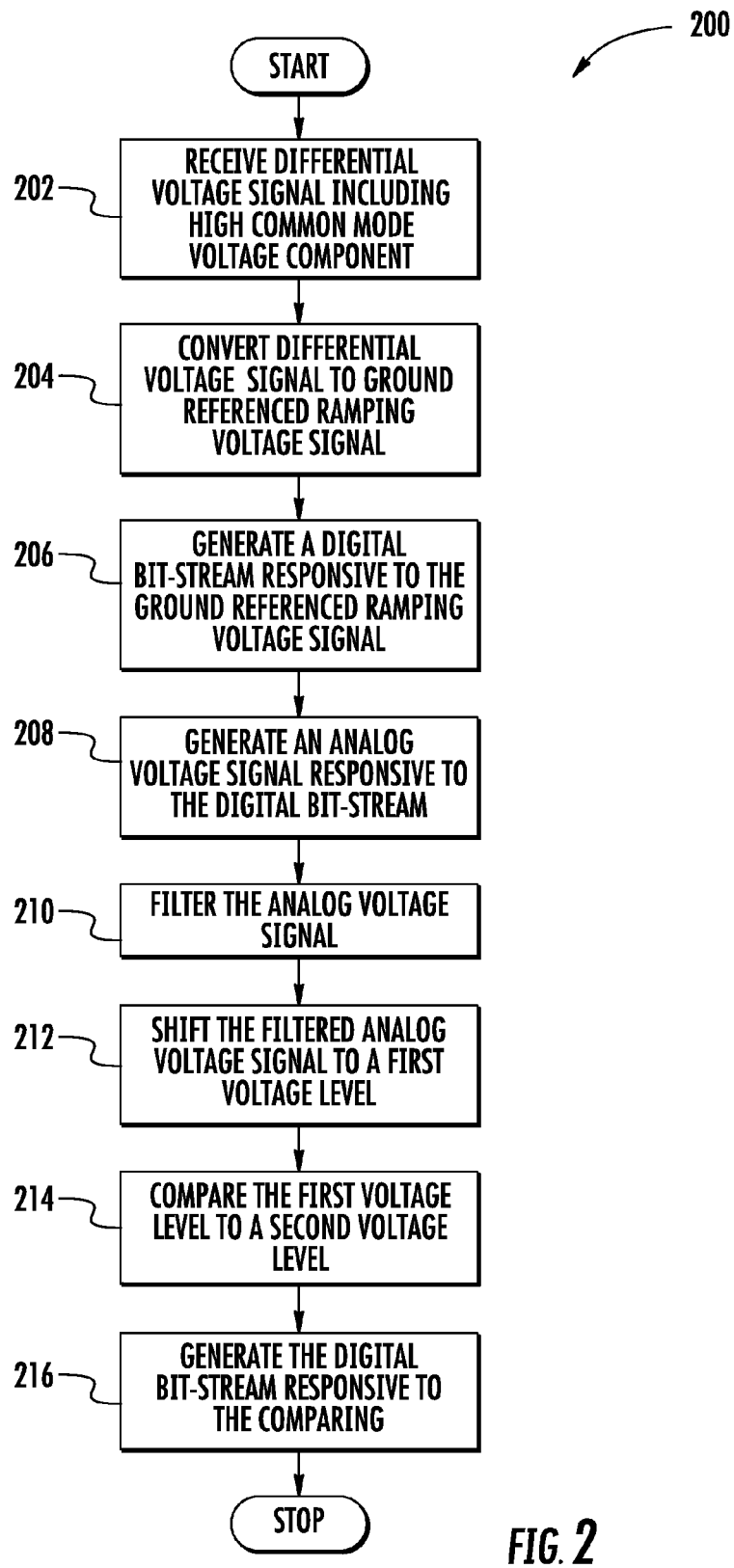
FIG. 2 depicts a flow diagram illustrating a method of converting a differential voltage signal including a high common mode voltage component to a ground referenced signal, in accordance with one exemplary embodiment of the present invention.

FIG. 2 depicts a flow diagram illustrating a method 200 of converting a differential voltage signal including a high common mode voltage component to a ground referenced signal, in accordance with one exemplary embodiment of the present invention. Referring to FIGS. 1 and 2 for this exemplary embodiment, the method 200 begins with the first comparator 102 receiving a differential voltage signal including a high common mode voltage component (202). For example, the differential voltage signal including a high common mode voltage component can be a differential voltage from one of the cells 10 and coupled via the multiplexer/switch 20. The differential voltage signal including the high common mode voltage component is then converted to a low level ramping voltage (204). For example, the signal at the output of the first comparator 102 can be converted to a low level ramping voltage by the digital level shifter 104 and the first integrator 106. A digital bit-stream is then generated in response to the low level ramping voltage (206). This function can be performed, for example, by the $2^{nd}$ order sigma-delta ADC 126. An analog voltage is then generated in response to the digital bit-stream (208), and the analog voltage is filtered to produce a current associated with the analog voltage (210). For example, the 1-bit DAC 118 can be utilized to generate the analog voltage from the digital bit-stream, and the low pass filter 120 can produce the current associated with the analog voltage. The filtered analog voltage (current) is then converted to a high level voltage (212). For example, the low side and high side analog level shifters 122, 123 can be utilized to convert the current to the high level voltage. The converted high level voltage is then compared with the received differential voltage signal including the high common mode voltage component (214). For example, the comparing can be performed by the first comparator 102. The digital bit-stream is then generated in response to the comparing (216). For example, the digital bit-stream can be generated by the remaining components of the front-end circuitry 124 and the $2^{nd}$ order sigma-delta ADC 126.

Figure 3:
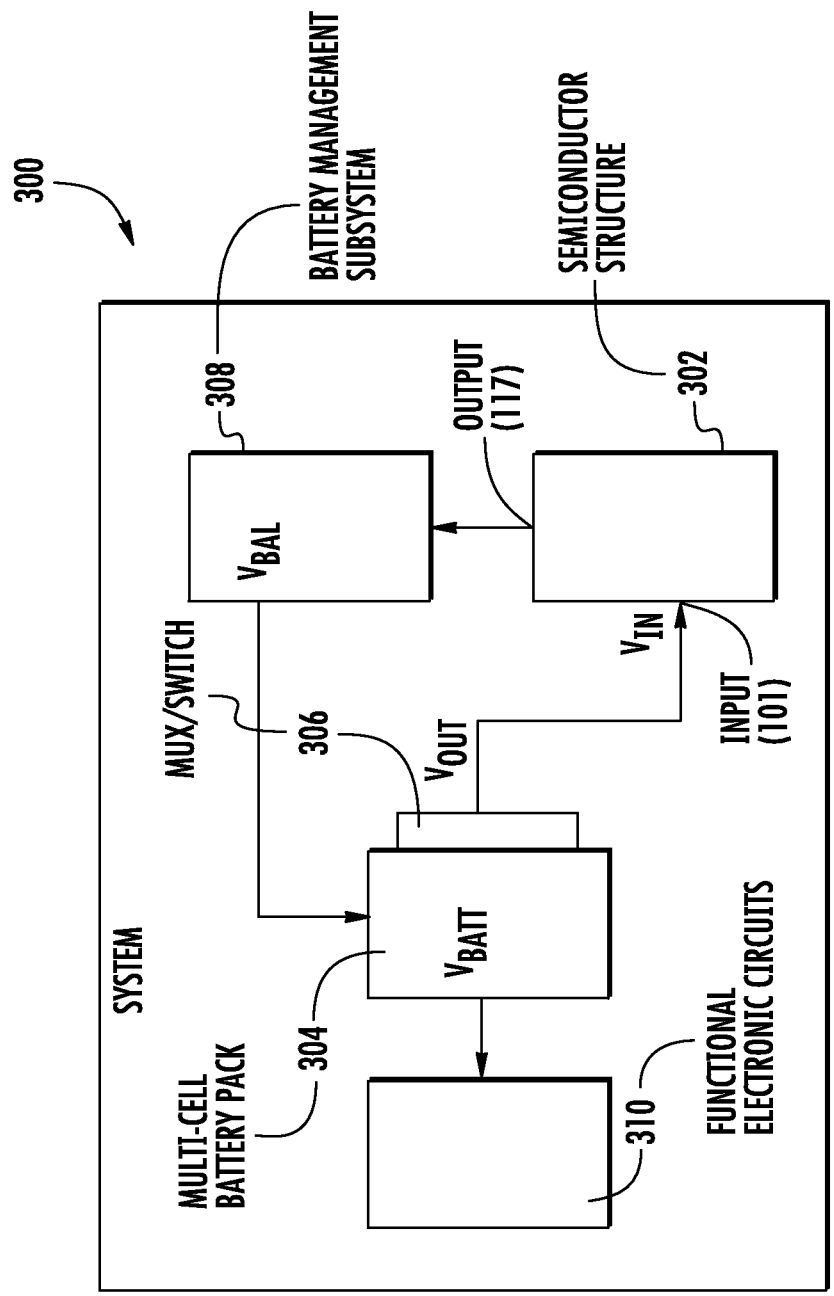
FIG. 3 depicts a schematic block diagram of an exemplary system, which can be utilized to implement one or more exemplary embodiments of the present invention.

FIG. 3 depicts a schematic block diagram of an exemplary system 300, which can be utilized to implement one or more exemplary embodiments of the present invention. For example, in one embodiment, system 300 includes one or more circuits 302 for converting a differential voltage signal including a high common mode voltage component to a ground referenced signal, a multi-cell battery pack 304, one or more multiplexers (or transistor switches) 306, a battery management subsystem 308, and a plurality of functional electronic circuits 310. For example, system 300 can include a power management system and/or a battery management system utilized to provide accurate monitoring, measuring, balancing, and diagnostic functions for multiple cells in an electrically-driven motor vehicle. As such, system 300 can be a battery management system utilized, for example, to provide power in a hybrid electric vehicle, e-bike, e-motorcycle, e-scooter, and the like.

Referring to FIG. 3, each one of the circuits 302 can be implemented with the semiconductor structure 100 shown in FIG. 1. For the example embodiment shown, the output differential voltage, Vout, of each of the cells 304 is coupled via the multiplexer (and/or transistor switch) 306 to a pair of input terminals, Vin (e.g., 101a, 101b in FIG. 1), of the one or more circuits 302. The digital signal at the output terminal (e.g., 117 in FIG. 1) of the one or more circuits 302 is coupled to an input terminal of a battery management subsystem 308. For example, the battery management subsystem 308 can include a microcontroller that receives the digital signal from the output (117) of the circuit 302. The microcontroller in the battery management subsystem 308 then utilizes the received digital data to perform accurate cell voltage monitoring, cell voltage balancing, and diagnostic functions for the cells involved. For example, in the embodiment shown, a cell balancing voltage signal, $V_{BAL}$, is provided at the output terminal of the battery management subsystem 308, and coupled to the multi-cell battery pack 304. The battery voltage, $V_{BATT}$, at the output of the multi-cell battery pack 304 is coupled to one or more of the functional electronic circuits 310 that are utilized to operate the electrically-powered automotive system involved (e.g., electric vehicle, e-bike, e-motorcycle, e-scooter, and the like). Consequently, the performance of system 300 is significantly enhanced compared to other battery power or battery management systems performing similar functions. Note that although the example embodiment shown in FIG. 3 can be utilized as a battery management system for automotive applications, in some embodiments, the circuit 302 for converting a differential signal including a high common mode voltage component to a ground referenced signal can also be utilized for monitoring battery performance in non-automotive applications, such as, for example, in power tools, laptop computers, servers, power storage systems, and the like.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present invention be limited only by the claims and the equivalents thereof.

What is claimed is:

1. A method of converting a differential signal including a high common mode voltage component to a ground referenced signal, comprising:
   receiving a differential voltage signal including a high common mode voltage component;
   converting the differential voltage signal to a ground referenced ramping voltage signal; and
   generating a digital bit-stream responsive to the ground referenced ramping voltage signal.

2. The method of claim 1, further comprising:
   generating an analog voltage signal responsive to the digital bit-stream;
   filtering the analog voltage signal;
   shifting the filtered analog voltage signal to a first voltage level on a first input terminal of a first comparator;
   the first comparator comparing the shifted filtered analog voltage signal on the first input terminal to a second voltage level on a second input terminal of the first comparator; and
   generating the digital bit-stream responsive to the comparing.

3. The method of claim 1, wherein the converting comprises shifting an output signal of a first comparator to a ground referenced digital signal, and integrating the ground referenced digital signal.

4. The method of claim 1, wherein the generating the digital bit-stream comprises:
   generating an analog voltage signal responsive to the digital bit-stream;
   summing the analog voltage signal with the ground referenced ramping voltage signal and generating a first summed signal;
   integrating the first summed signal;
   summing the analog voltage signal with the integrated first summed signal and generating a second summed signal;
   integrating the second summed signal; and
   a second comparator generating the digital bit-stream responsive to the integrated second summed signal.

5. The method of claim 1, wherein the generating the digital bit-stream responsive to the ground referenced ramping voltage signal comprises generating the digital bit-stream utilizing a second order sigma-delta analog-to-digital converter.

6. A circuit, comprising:
   a first comparator including a pair of input terminals coupled to a differential voltage signal including a high common mode voltage component and configured to output a digital signal;
   a first level shifter configured to receive the digital signal and shift the level of the digital signal to a low level; and
   a first integrator configured to receive the low level digital signal and output a ramping voltage signal associated with the low level digital signal.

7. The circuit of claim 6, further comprising:
an analog-to-digital converter configured to receive the ramping voltage signal and output a second digital signal associated with the ramping voltage signal.

8. The circuit of claim 7, further comprising:
a filter configured to receive an analog voltage signal associated with the second digital signal and output a current associated with the analog voltage signal; and
a second level shifter configured to receive the current, convert the current to a shifted voltage signal relative to a voltage on a first input terminal of the pair of input terminals, wherein the first comparator is configured to receive the shifted voltage signal at one input terminal of the pair of input terminals and a first voltage level on a second input terminal of the pair of input terminals.

9. The circuit of claim 8, wherein the filter and the second level shifter comprise a feedback loop configured to maintain the ramping voltage signal at an average level that corresponds to the differential voltage signal.

10. The circuit of claim 7, wherein the analog-to-digital converter comprises:
a digital-to-analog converter configured to receive the output second digital signal and convert the output second digital signal to an analog voltage signal;
a first summing junction configured to receive the analog voltage signal and the ramping voltage signal and add the analog voltage signal to the ramping voltage signal;
a second integrator configured to integrate a first summed signal received from the first summing junction;
a second summing junction configured to receive the analog voltage signal and the integrated first summed signal;
a third integrator configured to integrate a second summed signal received from the second summing junction; and
a second comparator configured to receive the integrated second summed signal and output the second digital signal.

11. The circuit of claim 7, wherein the analog-to-digital converter comprises a second order sigma-delta analog-to-digital converter.

12. The circuit of claim 7, wherein the analog-to-digital converter comprises an integrating analog-to-digital converter.

13. The circuit of claim 7, wherein the circuit comprises a front end voltage measurement circuit and a second order sigma-delta analog-to-digital converter on a semiconductor integrated circuit, wafer, chip or die.

14. The circuit of claim 6, wherein the differential signal including the high common mode voltage component is a differential voltage associated with a cell voltage of at least one battery cell of a stack of battery cells.

15. The circuit of claim 6, wherein the differential voltage signal including a high common mode voltage component is associated with a voltage across a thermocouple sensor.

16. A system, comprising:
a plurality of battery cells;
a plurality of functional electronic circuits coupled to the plurality of battery cells and configured to receive operating power from the plurality of battery cells;
a multiplexer coupled to the plurality of battery cells;
a circuit coupled to the multiplexer; and
a battery management subsystem coupled to an output of the circuit and the plurality of battery cells, wherein the multiplexer is configured to couple a differential voltage signal including a high common mode voltage component indicating a cell voltage of one cell of the plurality of cells to an input of the circuit, the battery management subsystem is configured to output a voltage signal representing at least the cell voltage of the one cell of the plurality of cells, and wherein the circuit comprises:
a first comparator coupled to the differential voltage signal including the high common mode voltage component, and configured to output a first digital signal associated with the differential voltage signal;
a first digital level shifter configured to receive the first digital signal and shift the level of the first digital signal to a low level second digital signal;
a first integrator configured to receive the second digital signal and output a ramping voltage signal associated with the second digital signal; and
an analog-to-digital converter configured to receive the ramping voltage signal, and output a digital bit-stream associated with the ramping voltage signal.

17. The system of claim 16, wherein the system comprises a battery management system or a power management system for an electrically-driven motor vehicle.

18. The system of claim 16, wherein the system comprises a power tool, laptop computer, server, or power storage system.

19. The system of claim 16, wherein the circuit is formed on a semiconductor integrated circuit, wafer, chip or die.

20. The system of claim 16, wherein the circuit comprises an application front end coupled to an analog-to-digital converter.

* * * * *